United States Patent [19]

Watson

[11] Patent Number: 5,042,146

[45] Date of Patent: Aug. 27, 1991

[54] METHOD AND APPARATUS OF MAKING AN ELECTRICAL INTERCONNECTION ON A CIRCUIT BOARD

[76] Inventor: Troy M. Watson, 5672 East Kelso St., Tucson, Ariz. 85712

[21] Appl. No.: 475,952

[22] Filed: Feb. 6, 1990

[51] Int. Cl.$^5$ .............................................. H05K 3/00
[52] U.S. Cl. ...................................... 29/845; 29/850; 174/251; 439/55
[58] Field of Search ................ 29/850, 845, 56.5, 509; 439/55; 174/251

[56] References Cited

U.S. PATENT DOCUMENTS

| | | | |
|---|---|---|---|
| 1,465,255 | 8/1923 | Dorsey . | |
| 2,948,953 | 8/1960 | Rayburn | 29/155.55 |
| 2,958,926 | 11/1960 | Morison | 29/850 X |
| 3,022,369 | 2/1962 | Rayburn | 439/55 X |
| 3,114,194 | 12/1963 | Lotts | 29/850 |
| 3,253,324 | 5/1966 | Frey et al. | 29/850 X |
| 3,646,296 | 2/1972 | Olney Jr. | 174/251 |
| 3,722,379 | 5/1973 | Focarile | 179/91 |
| 3,887,904 | 6/1975 | Krag | 29/850 X |
| 3,960,309 | 6/1976 | Hazel | 228/5.1 |

FOREIGN PATENT DOCUMENTS 2832075 1/1980 Fed. Rep. of Germany .
143345 8/1980 Fed. Rep. of Germany .

Primary Examiner—Carl J. Arbes
Attorney, Agent, or Firm—J. E. McTaggart

[57] ABSTRACT

Insulated hookup wire is processed to provide point-to-point interconnections on a circuit board, including helical terminals formed integrally from stripped portions of the hookup wire and set into circuit board holes; the helical terminals serve as receptacles for contact pins of components such as DIP ICs, leads of components such as resistors or capacitors, or even for stripped ends of additional hookup wire, for example in interboard wiring. Regular dip or wave soldering may be performed subsequently. For special purposes, the wiring system of this invention may be utilized throughout a circuit board, or else it may be utilized strategically to supplement regular printed circuitry. In a three piece machine tool set, a shaped mandrel rotates to wind a portion of stripped wire into a dual interleaved helix and then press the helix into place as a helical terminal/receptacle in a circuit board hole, with one or two insulated hookup wires integrally attached for interconnection. A dual wire handling mechanism implements the installation of twisted pair runs which may include pairs of terminals at intermediate locations as well as at each end of a run. Such twisted pairs utilized as balanced transmission lines outperform unshielded printed circuit parallel microstrip lines in suppressing crosstalk and r.f. interference, and may enable transmission of critical digital and high frequency signals between widely separated regions of a circuit board while avoiding the cost, complexity, producibility and reliability penalties involved in the classic alternatives of adding several layers in a multilayer circuit board to provide buried stripline transmission paths or handwiring flexible or rigid coaxial cable runs with associated interfacing difficulties.

8 Claims, 6 Drawing Sheets

METHOD AND APPARATUS OF MAKING AN ELECTRICAL INTERCONNECTION ON A CIRCUIT BOARD

FIELD OF THE INVENTION

The present invention, in the field of electronic circuit board technology, relates to methods and apparatus for machine processing and installation of insulated hookup wire, especially in twisted pairs, in a manner to provide integrally interconnected component contact receptacles, formed from the wire, installed in a circuit board.

BACKGROUND OF THE INVENTION

In electronic circuit boards, even though the great majority of interconnections may be implemented as printed conductive traces, there are special circumstances in which it would be advantageous to interconnect particular components through insulated hookup wire. For example, the usual printed traces often prove unsatisfactory for routing a high speed digital signal from one region of the circuit board to another region due to inherent properties of printed traces which severely limit attempts to utilize them as high frequency transmission lines. The main shortcoming is susceptibility to crosstalk and r.f. interference even in attempts to form a "balanced" line from a pair of parallel traces, especially if they are unshielded at the circuit board surface in a usual microstrip configuration.

A classic solution to this type of problem is to form integral pseudo-coaxial signal paths within the circuit board by adding several additional circuit board layers to form buried stripline printed traces as signal paths sandwiched between ground plane shield layers in a multilayer circuit board configuration, imposing as a tradeoff penalty the greatly increased cost, complexity, fabrication difficulty and potential unreliability of a multilayer circuit board.

An alternative classic solution involves the addition of discrete runs of rigid or flexible coaxial cable: this is also costly and complex, usually entailing a great deal of skilled manual fabrication and assembly, and often suffers from impedance compromises along printed trace interface runs between the ends of the coaxial cables and the actual component terminals involved.

A third alternative, which has not been fully exploited heretofore, utilizes an unshielded twisted pair of insulated hookup wires serving as a balanced transmission line. The twisted pair configuration, by virtue of an inherent antenna effect cancellation property, provides superior crosstalk isolation over a single unbalanced line or parallel pair configuration such as microstrip lines formed on the surface of a circuit board, and, while not fully equivalent to shielded coaxial cable, twisted pair transmission lines, particularly in the novel implementation of this invention, will in many instances provide fully satisfactory signal transmission performance along with considerable cost, simplification, producibility and reliability benefits by avoiding the need for multilayer circuit boards and/or coaxial cables.

There are other situations where it may be preferable to fabricate a circuit board utilizing point-to-point hookup wiring throughout, for example, in realizing a preliminary "breadboard" model for evaluation and/or experimentation in advance of the availability of a "tooled-up" printed circuit version.

Point-to-point hand wiring as sometimes practiced in low volume production of circuit boards is generally tedious and costly, particularly where wire ends must be individually wrapped manually onto pins or terminal lugs and soldered individually.

As an alternative to hand wiring, a well known "wire wrap" technique involves wrapping the stripped ends of special hookup wire in a long tight spiral around special square elongated contact posts; frequently it is necessary to mount components such as DIP (dual in-line packaged) devices, in special sockets having the required square posts, which, when wired correctly with a wrap of sufficient length, are supposed to provide reliable connections without soldering. "Wire wrap" is generally incompatible with standard dip or wave soldering since the presence of wiring on the side opposite the "component" side, i.e. on the "trace" side, which is normally immersed in molten solder at a temperature which would destroy the hookup wire insulation; therefore, any connections requiring soldering must be done individually, typically by hand.

"Wire wrap" is generally useful only at relatively low digital rates or frequencies, having proven unsuitable for handling some families of high speed logic such as ECL (emitter coupled logic) due to degradation of rise and fall times due to signal line termination impedance mismatches introduced by the elongated square posts.

The present invention provides a beneficial supplement, and in some instances a viable alternative, to a range of conventional circuit board practices including printed circuitry as well as hand wiring and wire wrapping.

OBJECTS OF THE INVENTION

It is a primary object of the present invention to provide a novel method for providing point-to-point wiring on a circuit board, utilizing insulated hookup wire to form integrally interconnected component contact receptacles installed in circuit board holes.

It is a further object to provide fabrication apparatus for implementing the primary object by forming helical shaped terminals from stripped portions of hookup wire and pressing the terminals into circuit board holes, the helical terminals being made capable of serving as receptacles for component terminal pins.

It is a further object that circuit boards may be fabricated in accordance with the foregoing objects in a manner to be compatible with normal dip or wave soldering techniques.

It is a still further object to provide such apparatus with capability of stripping portions of insulated hookup wire, twisting a pair of insulated wires together and installing a run of the twisted pair into a circuit board including pairs of terminals formed integrally from the hookup wires in accordance with the aforementioned objects.

Still further to the foregoing object, it is an object to provide capability of forming and installing such pairs of terminals at intermediate points along a run of twisted pair hookup wire as well as at the ends of the run.

An understanding of how the present invention has accomplished these and other objects and advantages will become apparent from a study of the following description with reference to the accompanying drawings.

DETAILED DESCRIPTION

Figure 1:
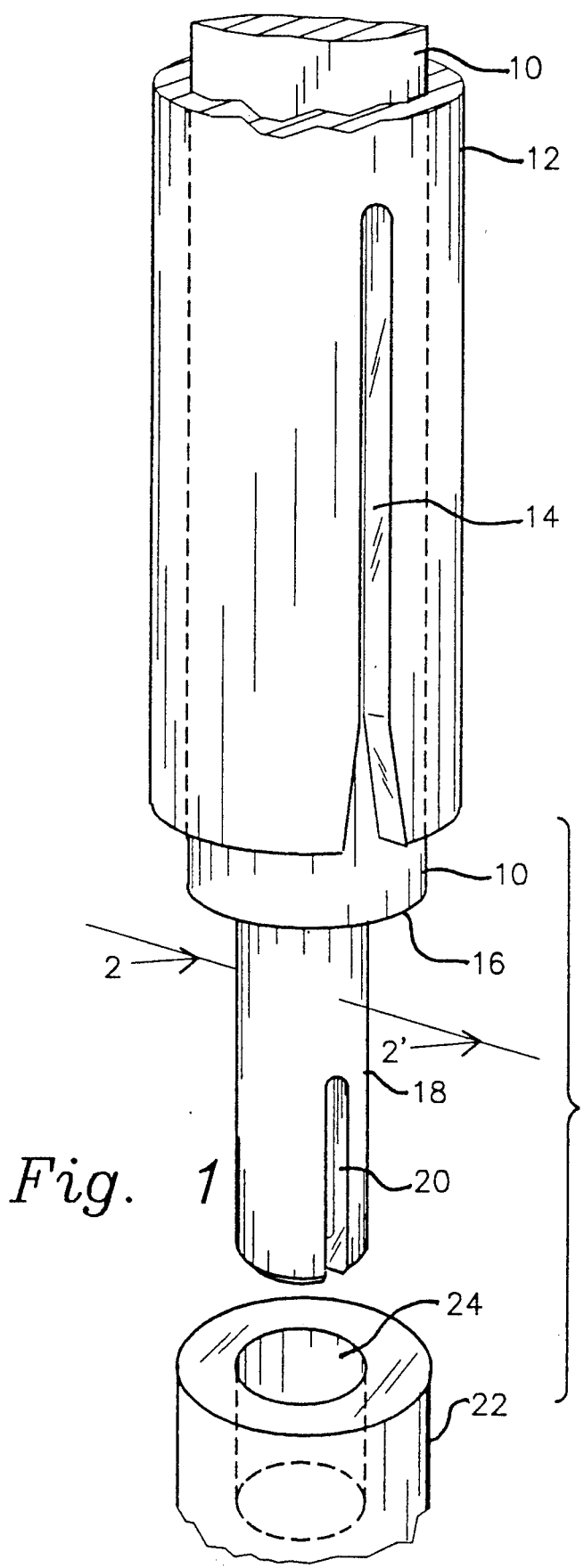
FIG. 1 is a perspective view of a three part machine tool set for forming and installing hookup wire in accordance with the present invention.

The perspective view of FIG. 1 shows a three piece tool set which is understood to be mounted in an arbor type fabrication machine generally similar to a common type of vertical press in which a workpiece is normally placed on a platform disposed between upper and lower regions of the arbor configuration. Power manipulation of the tools is provided in a known conventional manner, typically via pneumatic or hydraulic mechanisms under automated or semi-automated control.

A main mandrel shaft 10 is made capable of both vertical travel and rotation about its vertical axis within a cylindrical sleeve guide 12 which is capable of vertical travel but constrained against rotation. Sleeve guide 12 is fitted with a pair of diametrically opposed vertical wire guide slots 14, one of which is visible in this view, extending to the bottom end and sized in width to clear the stripped diameter of the hookup wire to be used; the optional flared bottom region as shown facilitates wire capture.

The mandrel shaft 10 is configured to have at its lower end, starting at shoulder 16, a forming portion 18 of reduced diameter containing a wire holding recess 20 which extends at least diametrically across the bottom end and, in the preferred embodiment shown, part way upward on diametrically opposite sides toward shoulder 16.

Beneath the mandrel forming portion 18 is a forming cavity tool part 22 having an upward facing cylindrical cavity 24, coaxial with mandrel 10, dimensioned to accept the lower end of the mandrel forming portion 18. The cavity tool part 22, which is mounted in the lower arbor portion of the host machine, is made capable of vertical travel and is provided with freedom to rotate about its vertical axis; rotation normally occurs only as engagedly driven from rotation of mandrel 10.

For clarity of illustration, the mandrel 10 is shown with shoulder 16 exposed at the lower end of sleeve guide 12; in operation, mandrel 10 will travel within a range above the position shown such that shoulder 16 will remain inside sleeve guide 12. The mandrel 10 and sleeve guide 12 are mounted in the upper arbor portion of the host machine.

Figure 2:
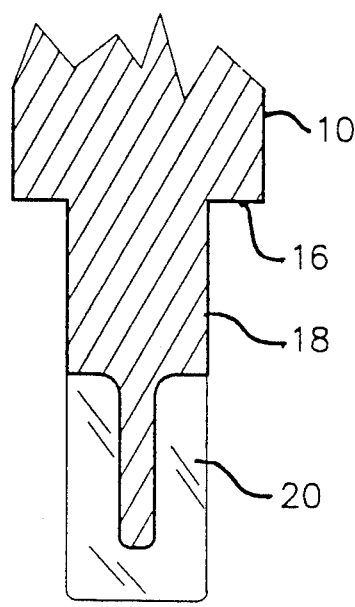
FIG. 2 is a cross section of a mandrel portion of FIG. 1.

FIG. 2 is a cross-section of the forming portion 18 of mandrel 10 taken through axis 2—2' of FIG. 1, showing the shoulder 16 and end-surround recess 20.

Figure 3:
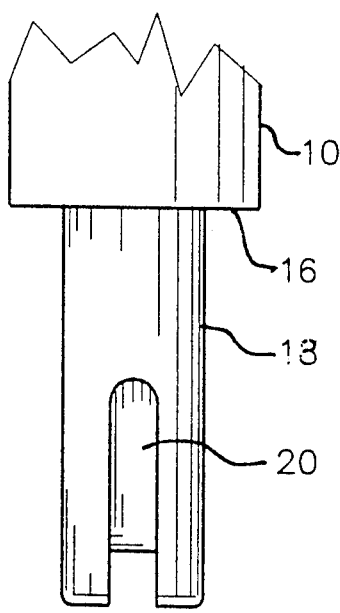
FIG. 3 is a side elevation of the mandrel portion of FIGS. 1 and 2.

FIG. 3 is a side elevation of the forming portion 18 of mandrel 10 as viewed at an angle of 90 degrees from the view of FIG. 2, showing the the shoulder 16 and end-surround recess 20.

FIGS. 4a–4e show a series of cross-sections of the tool set of FIGS. 1, 2 and 3 in five steps during the process of forming a length of hookup wire into a helical terminal and installing it into a circuit board in accordance with the present invention.

Figure 4A:
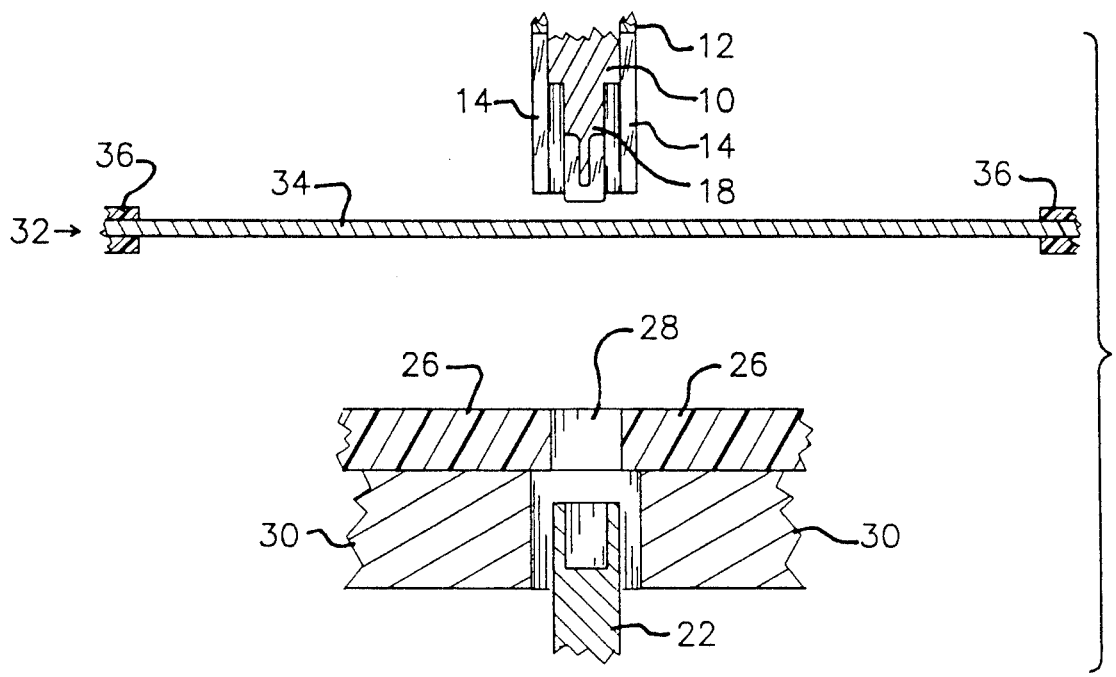
FIGS. 4a–4e show cross-sections of the tool set of FIG. 1 in a series of steps in the process of forming a length of hookup wire into a helical terminal and installing the terminal in a circuit board in accordance with the present invention.

In FIG. 4a, beneath the upper tool assembly comprising mandrel 10 and sleeve guide 12, a circuit board 26 having a hole 28 is placed on a work platform 30 and x-y positioned to center the hole 28 on the vertical axis of mandrel 10 and cavity tool 22 which is located below the circuit board 26 in a clearance opening provided in the work table 30.

Above circuit board 26 a length of insulated hookup wire 32, of which a bare wire portion 34 has been stripped of insulation 36, is centrally positioned across the vertical axis of mandrel 10.

The preliminary positions shown of the mandrel 10 and sleeve guide 12 above wire 32 and the cavity tool 22 below circuit board 26 permit initial placement of the wire 32 and circuit board 26 as workpieces.

Figure 4B:
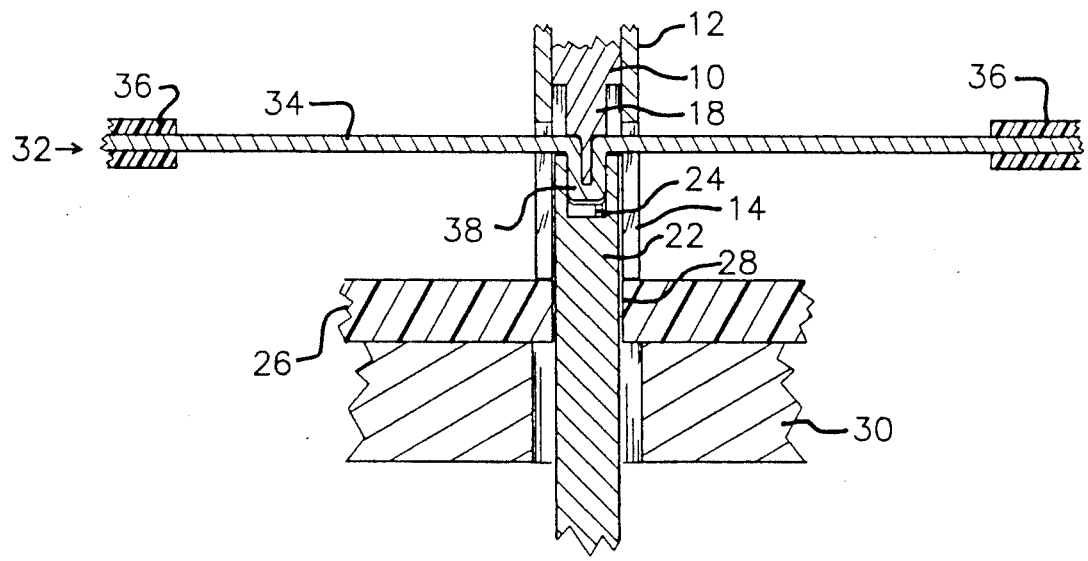

In FIG. 4b, the cavity tool 22 has been raised to protrude through the circuit board hole 28, and the sleeve guide 12 has been lowered onto the top surface of circuit board 26, capturing the stripped wire 34 in guide slots 14, following which the mandrel 10 has been lowered to capture wire 34 in recess 20 (refer to FIGS. 2 and 3) and then force the wire 34 into cavity 24 of tool 22, forming a U shaped wire loop 38 as shown. At this point, mandrel 10 is driven rotationally so as to wind the remaining adjacent portions of stripped wire 34 into a double interleaved helix while the rotationally driven mandrel 10 and and the cavity tool 22, driven rotationally from mandrel 10, are made to travel downwardly in accordance with the buildup of wire turns on the helix in the open region between portion 18 of the mandrel 10 and the inner wall of sleeve guide 12.

Figure 4C:
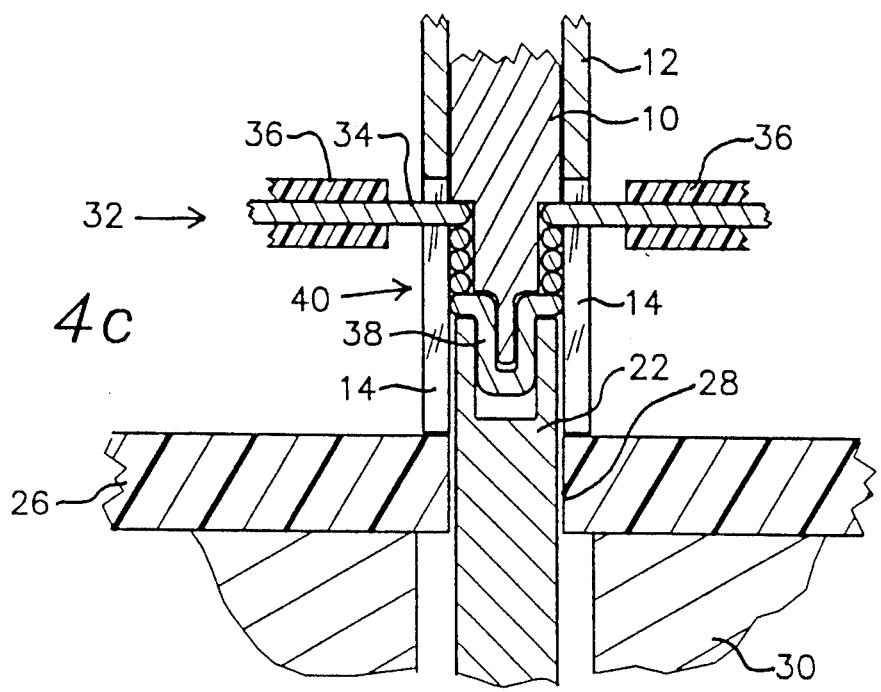

In FIG. 4c, at the completion of winding, the turns of wire 34 are seen in cross section forming a dual interleaved helix 40 extending upward toward the limits of slots 14; it is noted that winding the helix has drawn most of the stripped wire 34 inwardly from both directions through guide slots 14 so that the end points of insulation 36 now approach close to the helix 40, which is at this point ready to be installed into hole 28 of circuit board 26 as a helical terminal.

Figure 4D:
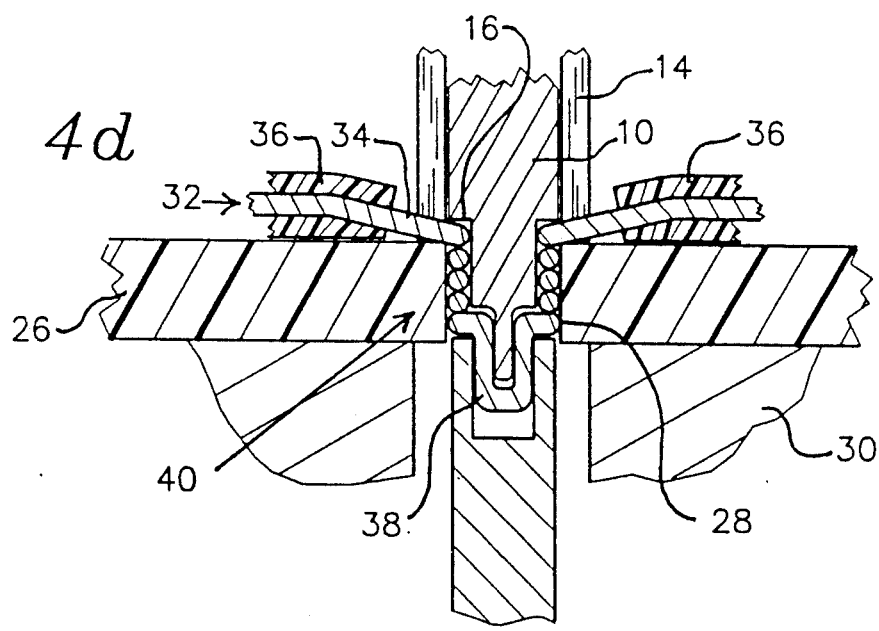

In FIG. 4d, mandrel 10 and cavity tool 22 have been lowered simultaneously and shoulder 16 has pressed helix 40 into hole 28 of circuit board 26 which now has insulation 36 of wire 32 resting on its upper surface, and the U shaped wire loop 38 protruding downward below its bottom surface.

Figure 4E:
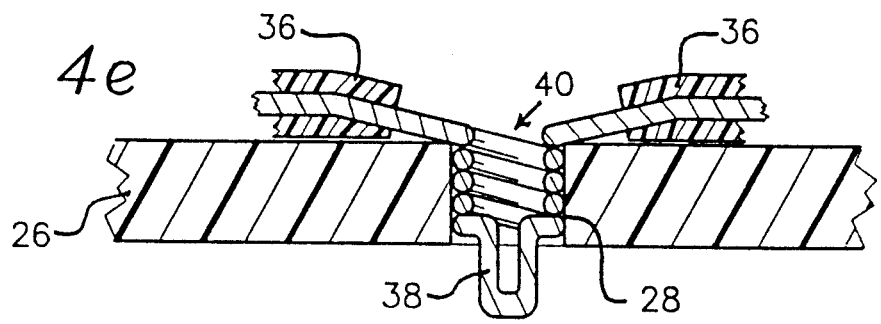

In FIG. 4e, the helical terminal 40 is seen in its installed position in hole 28 of circuit board 26 as in FIG. 4d but with the machine tools moved away, the mandrel and the sleeve guide having been retracted upwardly and the cavity tool retracted downwardly so as to allow removal or x-y repositioning of circuit board 26.

The dimensions of mandrel 10 and the wire size are chosen to make the outside diameter of helix 40 a light friction fit in the circuit board hole 28 while its inside diameter allows the helical terminal 40 to serve as a receptacle for insertion of a contact pin of a component such as a DIP IC (dual inline package integrated circuit), or for insertion of a stripped hookup wire end, for example in interconnecting to another circuit board.

In some instances it may be desired to subsequently solder the helical terminal 40 and the inserted pin or wire: this may be done individually or in a dip or wave soldering operation along with other printed circuit board pads.

Figure 5A:
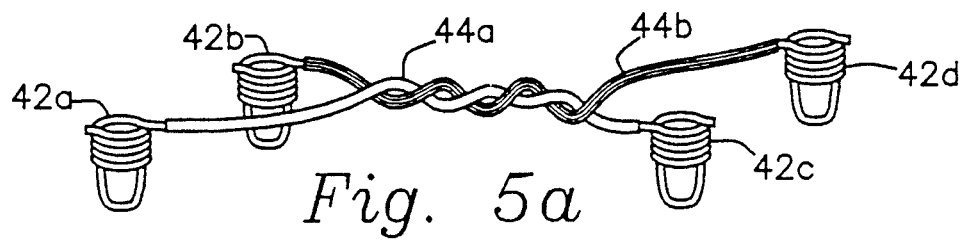
FIG. 5a shows two pairs of helical terminals interconnected by a twisted pair of hookup wires in accordance with the present invention.

FIG. 5a shows a typical twisted pair interconnection between two pairs of helical terminals 42a, 42b and 42c, 42d, formed in accordance with the present invention as described above in conjunction with configuring the interconnecting wires 44a and 44b as a twisted pair.

Figure 5B:
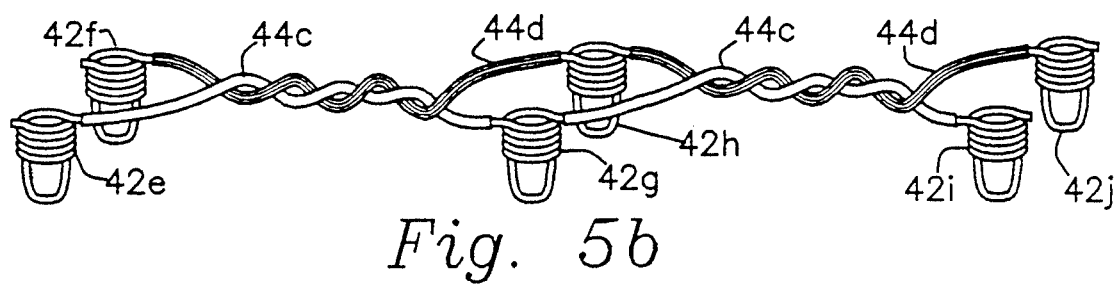
FIG. 5b shows a multiple interconnection of three pairs of helical terminals in a run of twisted pair hookup wire in accordance with the present invention.

FIG. 5b shows a typical multiple twisted pair interconnection of three pairs of helical terminals: 42e, 42f and 42i, 42j being formed at the ends of hookup wires 44c, 44d while 42g, 42h are formed from an intermediate stripped portion of the continuous run of wires 44c, 44d.

In FIGS. 5a and 5b it is assumed that the helical terminals are installed in holes in a circuit board; for clarity of illustration the circuit board is not shown. Typically the terminals of a pair are spaced 0.1" apart on a standard 0.1" grid pattern for circuit board hole locations.

Figure 6:
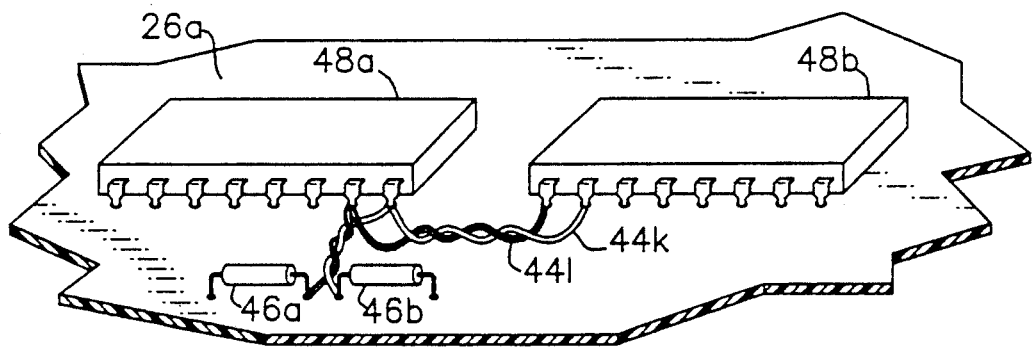
FIG. 6 shows an example of implementing the present invention in a typical manner with a twisted pair of hookup wires disposed on the component side of a circuit board interconnecting a group of components.

FIG. 6 illustrates a typical implementation of a multiple twisted pair run (as described in connection with FIG. 5b) exemplifying the manner in which components on a circuit board may be interconnected in accordance with the practice of this invention in its preferred embodiment. A pair of discrete components 46a, 46b which may be resistors, each has one of its contact pins retained in one of a pair of helical terminals formed from hookup wires 44k, 44l which connect components 46a, 46b through a length of twisted pair to a pair of helical terminals retaining a pair of contact pins of a DIP IC (dual in-line package integrated circuit) 48a, then continuing similarly through another segment of the twisted pair run to a pair of pins on a second IC 48b. It should be noted that the wire remains on the top side of circuit board 26a which is assumed to provide solder pads and conductive traces in the normal manner of well known printed circuit board technology for soldering from the bottom side by conventional dip or flow soldering methods. In the case of conventional double sided printed circuit boards, the presence of circuit traces on the top side of the board would in no way interfere with the practice of the present invention; of course the effective inside diameter of circuit board holes, whether plated-through or not, must be suitable to accept the helical terminals.

Figure 7:
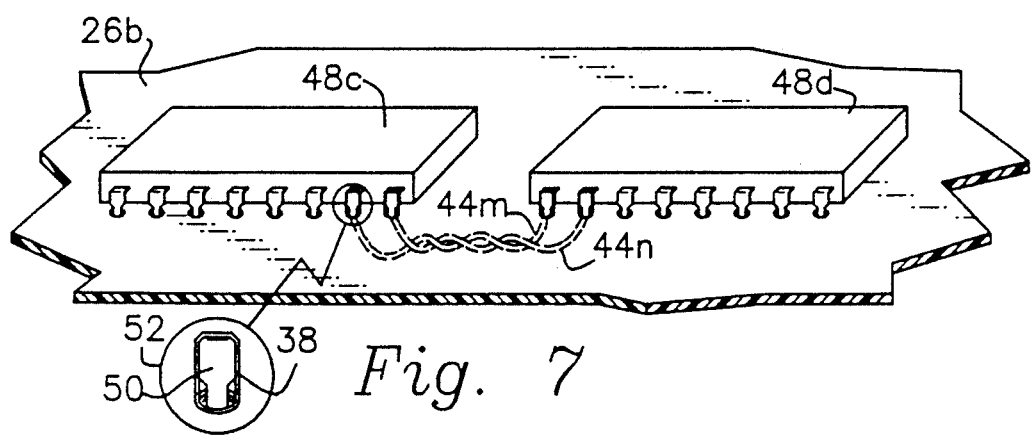
FIG. 7 shows an alternative implementation of the present invention with hookup wiring disposed on the circuit board side opposite the components.

As shown in FIG. 7, an alternative embodiment of this invention may locate the wiring on the side of the circuit board opposite the components, as illustrated by twisted hookup wire pairs 44m, 44n, shown dashed beneath the circuit board 26b, interconnecting DIP ICs 48c and 48d which are mounted on the top side of the circuit board 26b. For this type of mounting, the helical terminals would be inserted from the side of the circuit board opposite the component side so that the loop portion extends upwardly on the component side. This configuration enables a special fastening arrangement for DIP components: with appropriate sizing and shaping of the loop, it may be placed over the component lead 50 as shown in enlarged inset 52, to enhance retention of the component.

FIGS. 8a-8h illustrate process steps and related mechanism for stripping, twisting and installing hookup wire interconnections in accordance with this invention.

Figure 8A:
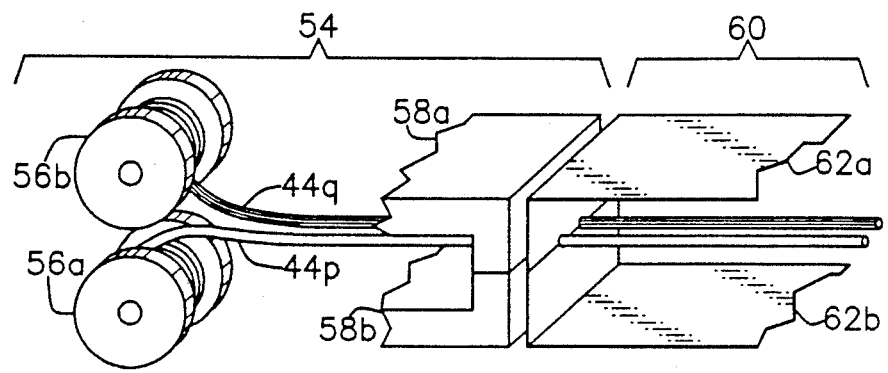
FIGS. 8a–8b illustrate process steps and related machine elements in stripping, twisting and installing hookup wire in accordance with the present invention.

FIG. 8a illustrates a basic method of stripping insulation from the ends of a pair of hookup wires simultaneously. In a wire feed mechanism 54, a pair of hookup wires 44p, 44q from spools 56a, 56b pass through a pair of wire guide jaws 58a, 58b in which the wires feed through a pair of guide openings formed from approximately half round grooves on each jaw. The feed mechanism 54 is adapted to provide three controlled modes: a clamping mode in which guide jaws 58a, 58b are clamped firmly onto the hookup wires 44p, 44q, a slipping mode wherein the clamping force is relaxed to allow the wires to be drawn through the guide jaws 58a, 58b, and an opened mode wherein the guide jaws may be fully disengaged by opening wide apart (as shown in FIG. 8d). In a stripping mechanism 60 (FIG. 8a), a pair of notched stripping jaws 62a, 62b are caused to close onto the insulated hookup wire as shown, severing the insulation at that point, then the stripping jaws 62a, 62b are moved toward the right so as to strip a length of insulation off the right hand end of the wires 44q, 44p while they are held in the clamped mode by guide jaws 58a, 58b.

Figure 8B:
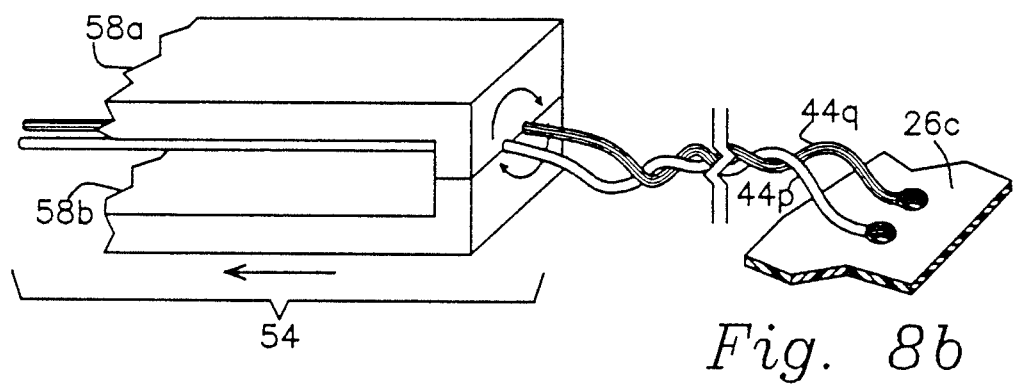

Then (as described in connection with FIGS. 4a-4e) each stripped end portion is formed into a helix and installed as a helical terminal with a single hookup wire attached, the pair appearing as at the right hand end of FIG. 8b installed in circuit board 26c.

Referring further to FIG. 8b, the wire feed mechanism 54 is made to rotate as indicated by the curved arrows shown on guide jaws 58a, 58b and to simultaneously travel toward the left relative to circuit board 26c as indicated so as to twist the wires 44p, 44q together uniformly as shown over any required length as they feed though guide jaws 58a, 58b, operating in the slipping mode.

Figure 8C:
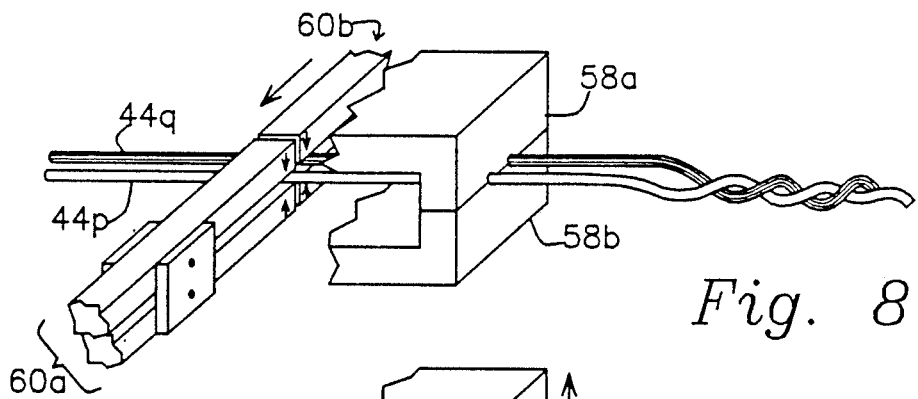
Figure 8D:
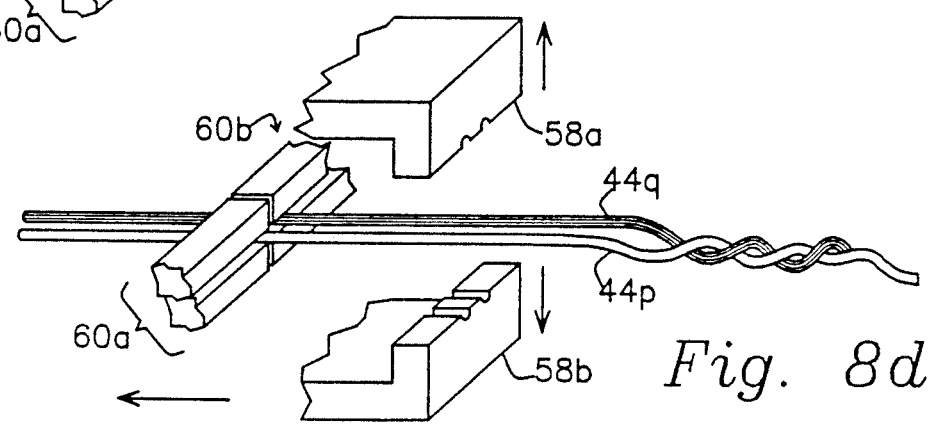
Figure 8E:
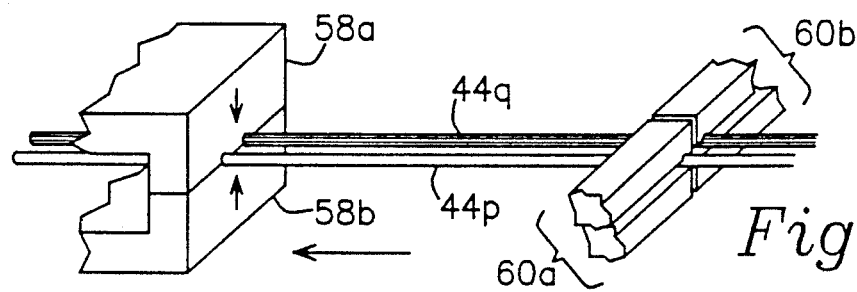

FIG. 8c shows the additional incorporation of two sets of wire grabbers 60a, 60b which are adapted to close onto the wires 44p, 44q respectively and retain them in place. Like the guide jaws 58a, 58b, grabbers 60a, 60b are fitted with wire guiding grooves and are enabled to operate in three different modes: clamping, slipping and opened. Thus with grabbers 60a, 60b clamping the wires 44p, 44q as shown, guide jaws 58a, 58b may be opened wide as shown in FIG. 18d, so that they can moved leftward as indicated, past the grabbers 60a, 60b and then, as shown in FIG. 8e, clamp the wires 44p, 44q at a new location, at left, in preparation for stripping a non-end portion of the hookup wire for forming a pair of helical terminals intermediate along a twisted pair run, such as terminals 42g, 42h in FIG. 5b.

Figure 8F:
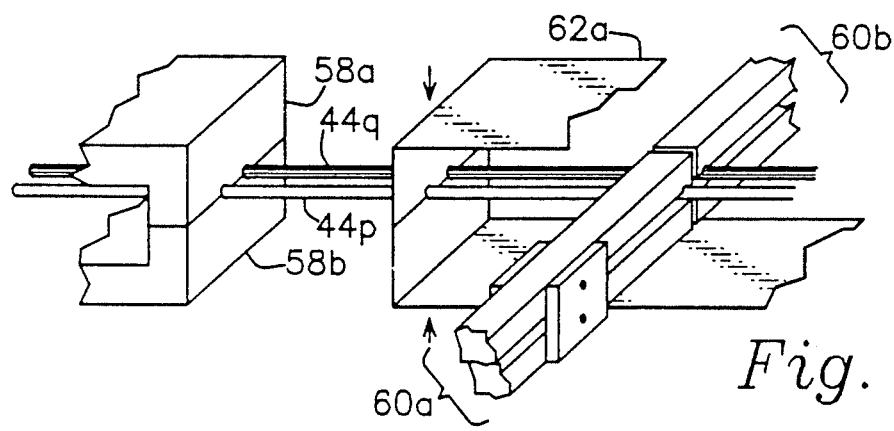
Figure 8G:
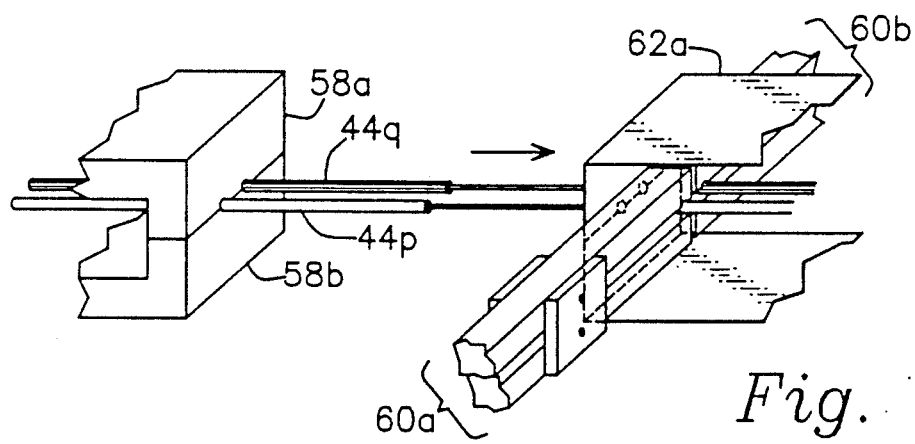

Referring now to FIG. 8f, stripping jaws 62a, 62b are closed onto the hookup wires 44p, 44q, severing the insulation, and then moved toward the right to strip the insulation from a designated portion of wire as shown in FIG. 8g. For some types of wire insulation, this operation may also require utilizing some form of longitudinal slitting blade (not shown) to facilitate non-end insulation stripping.

Figure 8H:
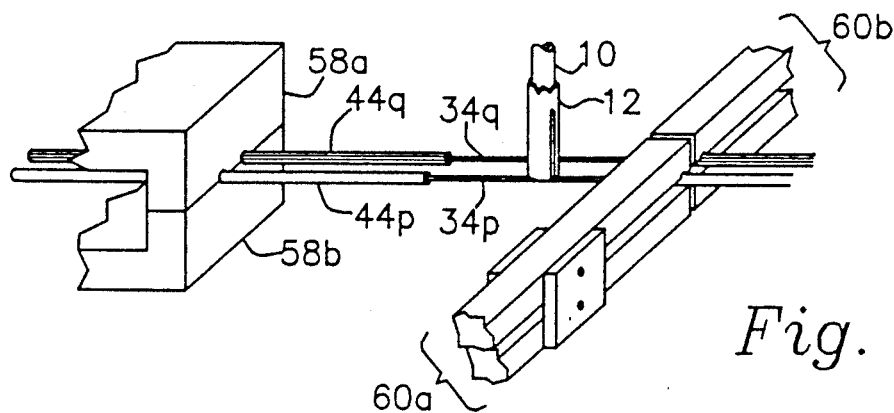

In FIG. 8h (as in FIG. 8g but with stripping jaws 62a, 62b removed) wires 44p, 44q are held in place by guide jaws 58a, 58b (in the clamped mode) and grabbers 60a, 60b (in the slipping mode). Recalling that the right hand end of wires 44p, 44q, as shown, are an end part of a partially installed twisted pair run (refer to FIGS. 8b–8d), a degree of slack will appear in the twisted pair run at this point as an allowance for terminal formation as follows. Mandrel 10 and sleeve guide 12 are shown, positioned over the stripped portion 34p of wire 44p. It is assumed that, as in FIG. 4a, a circuit board 26 is x-y positioned on a work platform 30 so as to align a designated hole 28 between mandrel 10 above and cavity tool 22 beneath. Mandrel 10 is lowered until its lower end captures stripped wire portion 34 at midpoint; then as cavity tool 22 moves up from below and contacts the wire 34, guide jaws 58a, 58b (FIG. 8h) are placed in the slipping mode and the cavity tool 22 moves further upward to form the loop 38 as shown in FIG. 4b. Then mandrel 10 is rotated to wind a helix and the helix is inserted into the circuit board hole to form a helical terminal as described in detail in connection with FIGS. 4b–4e. Referring once again to FIG. 8h, during the winding of the helix, insulated wire 44p is allowed to be pulled inwardly toward the helix from both directions since guide jaws 58a, 58b and grabbers 60a are in the slippage mode.

The arbor machine carrying the work table and the tool set comprising mandrel 10, guide sleeve 12 and the cavity tool is preferably made such that the vertical axis of the tool set may be set to either of two operating positions spaced apart a designated distance, such as 0.1″. Thus, in a continuation of the process described in connection with FIG. 8h, the tool set would be stepped to the alternate position to engage stripped portion 34q of hookup wire 44q and the above process repeated to form the second in the pair of helical terminals. Then, if the twisted wire interconnection is to be continued on to additional terminal locations, the entire process as described in connection with FIGS. 8b–8h is repeated as required. When the pair of terminals being formed are at the end of a run, the two wires 44p, 44q (FIG. 7h) are cut off at the left hand end of the stripped regions 34p, 34q (FIG. 7h) by a wire shearing tool before forming each corresponding terminal.

Dimensioning the tool parts and specifying the circuit board hole diameter and number of turns in the helix depend on wire size and circuit board thickness. Using #30 AWG (American wire gage) wire, which has a diameter of 0.0125″, a circuit board thickness of approximately 0.06″ accommodates a five turn helix, 0.0625″ in height. Referring to FIG. 1, to provide clearance for 0.07″ diameter at the upper portion of mandrel 10, sleeve guide 12 is made to have an inside diameter of 0.075″, which, with 0.042″ diameter at mandrel forming portion 18, provides a space of 0.0165″ for winding the 0.0125″ diameter wire.

The inside diameter of the helix will be 0.042″ as determined by the forming portion 18 of mandrel 10: this size easily accepts DIP contact pins which may be 0.015″ to 0.02″ in width, and is suited to other common component contact pins and hookup wire as large as #20 AWG (0.0375″).

The outside diameter of the helix will be 0.042″+0.0125″+0.0125″=0.067″, which dictates the required circuit board hole size.

The outside diameter of cavity tool 22 is made 0.06″ to easily clear a circuit board hole diameter of 0.067″, and the cavity 24 is made 0.05″ deep by 0.045″ diameter to accept the lower end of mandrel 10. The end-surround recess 20 on mandrel 10 is made 0.015″ in depth to accept the 0.0125″ wire, and typically extends 0.06″ upward on each side of the forming portion 18 of mandrel 10.

The foregoing tool dimensions are suitable for terminal spacing as close as 0.1″; closer spacing, such as 0.05″, may be provided by suitably scaling the tool dimensions and hookup wire size.

Long runs of twisted pair hookup wire may be secured to the circuit board by a fast curing adhesive cement.

A helical terminal may be utilized in conjunction with printed circuitry; if a terminal retaining a component pin is located in a circuit board hole which has a corresponding printed circuit pad on the foil side, regular dip or wave soldering will form a three way connection between the associated hookup wire, the pin and the pad.

There exists an option of utilizing the helical terminal, without any component being directly involved, to simply connect the associated hookup wire on the component side of the circuit board to a printed circuit pad on the opposite side, where the terminal would be dip or wave soldered in place along with the pad.

The U-shaped loop 38 (FIG. 4e) protruding below the circuit board may serve in some instances to provide clearance for the end of a component contact pin and/or it may serve as a terminal lug to which another component lead or hookup wire may be connected by through-insertion and/or wrapping, and then soldered. The size and shape of the loop may be modified by special shaping of the mandrel and cavity tools and/or the shape of the loop may be modified by post-forming in place on the circuit board. There also exists the option of eliminating the loop by configuring the mandrel, and controlling its vertical travel, so as to form only a straight run across the diameter of the helix at its lower end.

The above described preferred embodiment of fabrication apparatus of the present invention provides capability of processing a pair of hookup wires in a manner to provide a multiple terminal twisted pair configuration. It is to be understood that the apparatus described may be be easily operated in a simpler manner by the omission of particular process steps, for example when only a single wire, rather than a twisted pair, is to be processed and/or where terminals are to be formed only at wire ends. Similarly, for such less complex operations, it would be a simple matter to reduce the complexity of the apparatus accordingly to any of a number of more simplified embodiments utilizing only those essential elements of the apparatus required for particular wiring configurations.

The invention may be embodied and practiced in other specific forms without departing from the spirit and essential characteristics thereof. The present embodiments are therefore to be considered in all respects as illustrative and not restrictive, the scope of the invention being indicated by the appended claims rather than by the foregoing description; and all variations, substitutions and changes which come within the meaning range of equivalency of the claims are therefore intended to be embraced therein.

What is claimed is:

1. A method of providing, on a circuit board of designated thickness, electrical interconnections of hookup wire including contact receptacles, each formed from a designated portion of the hookup wire, adapted to accept component contact pins, the method comprising, with regard to each receptacle, the steps of:

(1) positioning a central region of the designated hookup wire portion diametrically across an open end of a cylindrical cavity of a cavity tool initially disposed so as to protrude substantially through a mounting hole in the circuit board;

(2) capturing the central region of the designated wire portion in a recessed region at an end of an elongated cylindrical mandrel;

(3) rotating the mandrel within a cylindrical sleeve guide tool so as to wind two halves of the designated wire portion together onto the mandrel in a manner to form within the sleeve guide tool a dual interleaved helix having a length approximating the circuit board thickness and having a coaxial cylindrical hollow core region with an open end;

(4) pressing the helix out of the sleeve guide tool and into the hole in the circuit board, the helix being positioned substantially within the thickness of the circuit board, so as to provide therein a wire-interconnected helical contact receptacle suited to accept insertion of a contact member such as a component contact pin or a hookup wire end; and (5) inserting a contact member into the hollow core region of the helical contact receptacle through the open end thereof.

2. The method of providing interconnections as defined in claim 1 wherein the hookup wire is of the insulated type, and wherein step (1) further comprises the prior step of:

stripping insulation from the hookup wire in a portion thereof designated for formation of a helix.

3. The method of providing interconnections as defined in claim 1 wherein step (2) further comprises the subsequent step of;

forming the wire in said captured portion along with adjacent portions thereto into a U shape, thus forming a wire loop which will become incorporated at a lower end of a helix subsequently formed thereupon.

4. Fabrication apparatus for providing, in a circuit board, hookup wire interconnections, including helical contact receptacles each formed from a designated portion of hookup wire and installed in a hole in the circuit board, the apparatus constituting a machine tool set comprising:

a mandrel adapted to engage the wire centrally within the designated portion, to then rotationally wind two halves of the designated portion in a manner to form a double interleaved helix, and to then press the helix into a circuit board hole, so as to enable the helix to serve as a contact receptacle, said mandrel being configured as an elongated circular rod, disposed concentrically around a vertical rotational axis, said mandrel having in an upper region a shaft portion of predetermined diameter and in a lower region a coaxial forming portion having a reduced diameter predetermined to yield a designated inside diameter in a helix formed thereupon, the forming portion having at a lower end thereof a recessed region, having a depth approximating the diameter of the wire, extending at least diametrically across the forming portion of the mandrel at a lower end thereof, said mandrel being configured to further provide a horizontal concentric step between the larger diameter shaft portion and the smaller diameter forming portion, the step being so located as to transmit downward movement of the mandrel onto a top surface of the helix and thus enable the mandrel to press the helix downwardly into a circuit board hole;

a cylindrical guide sleeve, disposed concentrically around said mandrel shaft portion so as to form therewith a rotational bearing surface, configured to have in a lower region a pair of diametrically opposed wire guide slots extending a predetermined distance vertically from a lower end of the sleeve tool part, the slots having a width equal to the diameter of the wire plus a predetermined clearance, and the lower region of the sleeve having a radius equal to that of the mandrel forming portion plus the diameter of the wire plus a predetermined clearance;

a lower cavity tool, disposed concentrically around the vertical rotational axis, adapted to supportingly engage the forming portion of said mandrel, having a cylindrical upper region with an outside diameter equal to that of the circuit board hole less a predetermined clearance, the cavity tool being disposed coaxially beneath said mandrel and being configured to provide an upward facing cylindrical cavity having a diameter equal to that of the mandrel forming portion plus a predetermined clearance;

a work platform adapted to support and retain the circuit board in a horizontal disposition, said platform being provided with a clearance opening, about the vertical rotational axis, sufficiently large to clear said lower cavity tool; and positioning means, associated with said platform, enabling horizontal positioning and retention of the circuit board such that the circuit board hole is centered on the vertical rotational axis.

5. The fabrication apparatus as defined in claim 4 further comprising:

a mandrel drive mechanism adapted to provide capability of controllably rotating said mandrel about the vertical axis while simultaneously enabling travel of said mandrel vertically within a predetermined range;

a guide sleeve positioning mechanism adapted to enable travel of said guide sleeve vertically within a range including a position wherein a lower end of the guide sleeve rests on an upper surface of the circuit board, said guide sleeve being constrained against rotation about its vertical axis; and a cavity tool positioning mechanism adapted to enable travel of said cavity tool vertically within a predetermined range while allowing free rotation of the cavity tool about the vertical axis.

6. The fabrication apparatus as defined in claim 5 further comprising;

a wire feed mechanism including a first spooled supply of wire and a pair of wire guide jaws adapted to position and constrain the wire in accordance with the practice of this invention;

a wire stripping mechanism adapted to remove predetermined portions of insulation from insulated hookup wire in accordance with the practice of this invention;

a wire grabber mechanism adapted to position and constrain the wire in cooperation with said wire feed mechanism; and a cutoff shear mechanism adapted to cut off the wire at a predetermined point.

7. The fabrication apparatus as defined in claim 6 wherein the apparatus is adapted to process two hookup wires so as to provide interconnection runs configured as twisted pairs of insulated hookup wire including pairs of helical terminals formed integrally from the wires;

said wire feed mechanism being adapted to include a second spooled supply of hookup wire and to provide rotational capability for twisting together, in predetermined lengths, a pair of wires, one from each of said first and second supplies of hookup wire; and said wire stripping mechanism, said wire grabber mechanism and said cutoff shear mechanism being adapted to facilitate implementation of the interconnection runs of twisted wire pairs in accordance with the present invention.

8. The fabrication apparatus as defined in claim 7 wherein the apparatus is adapted to provide two alternately selectable operating locations of the vertical axis of said tool set relative to said work platform, the two locations being horizontally separated by a distance equal to a designated terminal pair spacing, whereby a pair of helical terminals, separated by the designated spacing, may be formed and installed in a circuit board in accordance with this invention while the circuit board remains in a single fixed location relative to said work platform.

* * * * *